United States Patent [19]
Huang

[11] Patent Number: 5,976,959
[45] Date of Patent: Nov. 2, 1999

[54] METHOD FOR FORMING LARGE AREA OR SELECTIVE AREA SOI

[75] Inventor: Jammy Chin-Ming Huang, Taipei, Taiwan

[73] Assignee: Industrial Technology Research Institute, Hsin-Chu, Taiwan

[21] Appl. No.: 08/850,134

[22] Filed: May 1, 1997

[51] Int. Cl.⁶ .................................................. H01L 27/04
[52] U.S. Cl. ........................................... 438/487; 438/486
[58] Field of Search ..................... 438/166, 454, 438/486, 487; 148/DIG. 90, DIG. 91, DIG. 92

[56] References Cited

U.S. PATENT DOCUMENTS

| | | | |
|---|---|---|---|
| 4,752,590 | 6/1988 | Adams et al. ............................. | 437/84 |
| 4,822,752 | 4/1989 | Sugahara et al. . | |
| 4,997,780 | 3/1991 | Szluk et al. ................................ | 437/41 |
| 5,123,975 | 6/1992 | Irinoda et al. ........................ | 148/33.2 |
| 5,264,072 | 11/1993 | Mukai ................... | 156/620.7 |
| 5,340,435 | 8/1994 | Ito et al. . | |
| 5,371,381 | 12/1994 | Sugahara et al. . | |
| 5,373,803 | 12/1994 | Noguchi et al. . | |
| 5,387,537 | 2/1995 | Borel ........................................ | 437/62 |
| 5,393,370 | 2/1995 | Ohta et al. ............................... | 156/626 |
| 5,395,481 | 3/1995 | McCarthy ............................... | 156/630 |
| 5,431,126 | 7/1995 | Sameshima et al. . | |
| 5,484,746 | 1/1996 | Ichikawa et al. . | |
| 5,580,381 | 12/1996 | Yamagata . | |
| 5,786,242 | 7/1998 | Takemura et al. . | |
| 5,824,574 | 10/1998 | Yamazaki et al. . | |

*Primary Examiner*—Charles Bowers
*Assistant Examiner*—Martin Sulsky
*Attorney, Agent, or Firm*—George O. Saile; Stephen B. Ackerman

[57] ABSTRACT

An inexpensive method for fabricating defect-free, device quality single crystalline silicon layer on an insulator or on a glass substrate has been developed and disclosed herewith. This is accomplished by bonding a single crystalline silicon seed to the insulating substrate, followed by depositing a polysilixon or amorphous silicon layer and zone-melting the seed and the polysilicon junction by an excimer laser. As the excimer laser scans from the molten seed-polysilicon junction to the next adjacent polysilicon, the preceding molten section recrystallized into device quality single crystalline layer, until the entire polysilicon layer transforms into single crystalline film. This invention has particular application in fields of optoelectronics, sensors, high temperature electronics, radiation hard devices, display devices, MOSFET, and FET devices.

12 Claims, 4 Drawing Sheets

METHOD FOR FORMING LARGE AREA OR SELECTIVE AREA SOI

FIELD OF THE INVENTION

This invention relates to a method fabricating semiconductor device quality silicon film on insulating substrate having uniform thickness across the entire wafer or over selective patterned area.

DESCRIPTION OF THE PRIOR ART

The SOI technology offers the prospects of improved device isolation and radiation hardness and reduction of junction and parasitic capacitances. This technology has also been proposed as means of providing high-voltage and high-speed integrated circuits and has high expectation for means of providing three-dimensional semiconductor integrated circuits. One of the conventional SOI technology consists of depositing a polysilicon layer over an insulating layer such as thermally oxide film over the silicon substrate. The polysilicon film is then transformed into single crystal layer by controlling the recrystallization process through nucleation from a single point in the molten region, which has a temperature profile that is lowest at the center of the molten region and gradually higher toward the periphery of the region. In general, it is extremely difficult to attain such a temperature profile and the resulting recrystallized film invariably contains multiple grain boundaries and is not usable for IC fabrication even in small patterned area. In U.S. Pat. No. 5,264,072, R. Mukai has described a method of attaining the aforementioned temperature profile gradient to create a grain-boundary-free single crystal semiconductor in an extremely small and limited area within a device by varying the thickness of the thermal-conducting control (TCC) film over the polysilicon layer. Thus, the temperature of the TCC film is lower in the polysilicon under the thick TCC film than in surrounding polysilicon under the thin TCC film. The temperature gradient profile is established to allow single crystal formation under the thick TCC region after recrystallization by the conventional SOI indirect heating technique through a laser-absorbing layer. However, this SOI technique has limited device applications, since the required single crystalline area has to be extremely small, so that the probability of existence of a grain boundary in the recrystallized area can be substantially decreased but not completely eliminated.

Y. Ohta et al, in U.S. Pat. No. 5,393,370 have described a method of fabrication of large area by thinning down of a joined Si-oxide-Si structure, i.e. two Si substrate wafers with one of these having an oxidized film are stacked and bonded by heating to a prescribed temperature with the oxide sandwiched between the two Si substrate. One of the two Si substrates is thinned down to the desired thickness by dry-etching with in-situ monitored by visual light spectral interference method over small incremental areas across the entire wafer. This method is not only time consuming but the resulting SOI thickness variance of the thin-downed film is about 8.1±0.3 micrometers.

In U.S. Pat. No. 5,395,481, A. M. McCarthy discloses a method which is similar to the method described by Ohta et al, but with the additional use of a short wavelength excimer laser for doping activation and reduction of surface roughness during the etch-back.

This invention relates to a method for forming device quality single crystal layer that is grain-boundary free and defect-free on an insulator by using a seeding technique in combination with the recrystallization of amorphous or polysilicon layer by an excimer laser.

SUMMARY OF THE INVENTION

It is an object of this invention to provide a process for transforming a polycrystalline and or amorphous Si either selectively or entirely into device quality, grain-boundary free single crystal film on insulating substrates and on silicon oxide on silicon substrates.

It is another object of this invention to provide a reliable and convenient process which improves the yield of the integrated devices and circuits fabricated on the oxide-insulator substrate by enhancing the nucleation mechanism with a seeding technique.

It is another object of this invention to provide a reliable and convenient process which improves the yield of the integrated devices and circuits fabricated on the oxide-silicon substrate by seeding from the silicon substrate through an opening in the oxide.

It is still another object of this invention to avoid the FET device leakage problem due to stresses around and at the sharp edges and corners of the patterned polysilicon or amorphous silicon by using the excimer laser zone-melting recrystallization process.

In accordance with the present invention a process is described for fabricating device quality single crystal film over insulator. A silicon single crystal seed is bonded to the quartz or glass substrate surface. A silicon oxide film is deposited on the remainder surface of the glass substrate and over the seed single crystal. Photolithographic and etching procedures are performed to expose a portion of the top surface of the single crystal seed through the insulating film. A polysilicon or amorphous silicon film is deposited over the oxide film and in the opening over the exposed silicon seed surface. An alternative method of creating a single crystal seed is by opening an aperture in an oxide insulating film which was either grown or deposited on the surface of a single crystal silicon substrate, and followed by the deposition of polysilicon or amorphous silicon film. The conventional photolithographic and etching steps are performed to pattern the polysilicon. An excimer laser is scanned over the polysilicon or amorphous silicon beginning at the seed and polysilicon junction and creates a temperature gradient that initiates single crystalline recrystallization of the polysilicon from the crystalline orientation of the single crystal seed. As the excimer laser scans from the single crystal seed to the next adjacent segment of the polysilicon area, the recrystallization of the polysilicon into single crystal propagates along the laser scanning path. This invention thus disclosed a convenient and inexpensive method in the formation of device quality single crystal silicon films on high dielectric strength silicon dioxide layers on glass substrate. In such material, significant improvement in device performance and broad application can be realized in very small dimension devices such as susbmicron or deep submicron MOS devices, high voltage semiconductor devices such as discrete power transistors or integrated circuit components.

BRIEF DESCRIPTION OF THE DRAWINGS

The accompanying drawings illustrate embodiments of this invention and the description serve to explain the principles of this invention.

DESCRIPTION OF THE PREFERRED EMBODIMENTS

The method of fabricating device quality single crystal silicon over insulator substrate will now be described using a single crystalline silicon seed in combination with the use of a short wavelength laser first to focus and melt the buttedjunction portions of both the silicon single crystalline seed and the portion of polysilicon or amorphous silicon layer that is adjacent to the seed. As the laser scans from the melted single crystal seed-polysilicon junction towards the adjacent polysilicon, and causes the molten silicon to recrystallize and nucleate from the single crystal seed and convert the adjacent polysilicon into defect-free single crystalline silicon. The molten portion adjacent to the single crystalline seed will be recrystallized and the polysilicon or amorphous silicon adjacent to this newly formed single crystal will then be irradiated, melted and recrystallized. Thereby, the entire polysilicon film is transformed into single crystalline film as the excimer laser scans across the entire area from the single crystalline silicon seed. The advantage of this invention is that it permits the manufacturing of vast varieties of devices such as very low power devices, very fine-line devices, display devices, sensors, high temperature electronics devices, optoelectronics, radiation hard electronics, and high power transistors, hence only the specific areas unique to the understanding of this invention will be described in detail as follows.

Figure 1:
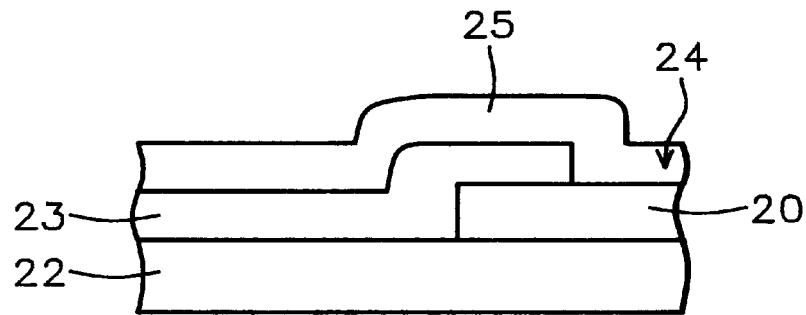
FIG. 1 schematically illustrates a cross-sectional view of the single crystalline seed bonded to a glass substrate with polysilicon film deposition prior to excimer laser recrystallization.
Figure 2A:
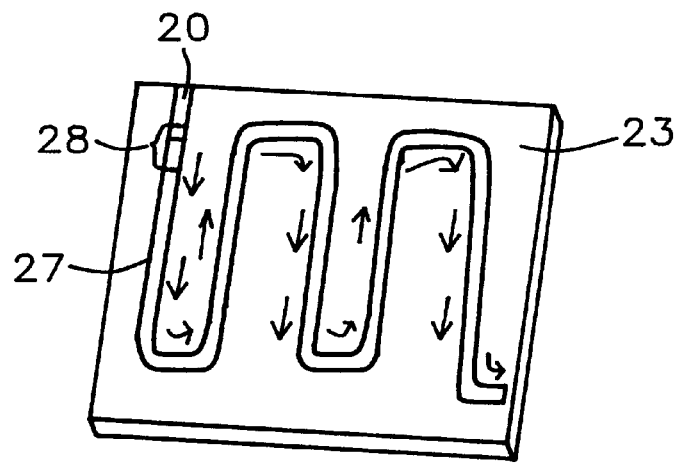
FIG. 2 schematically shows a top view of a patterned polysilicon which at end butted to a single seed on a glass substrate.
Figure 2B:
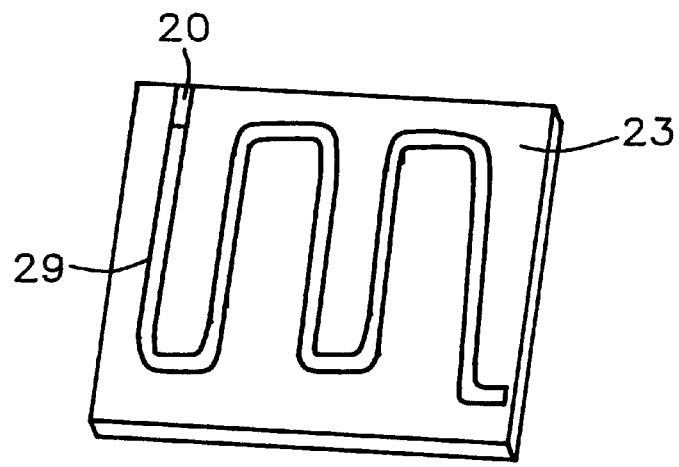
Figure 3A:
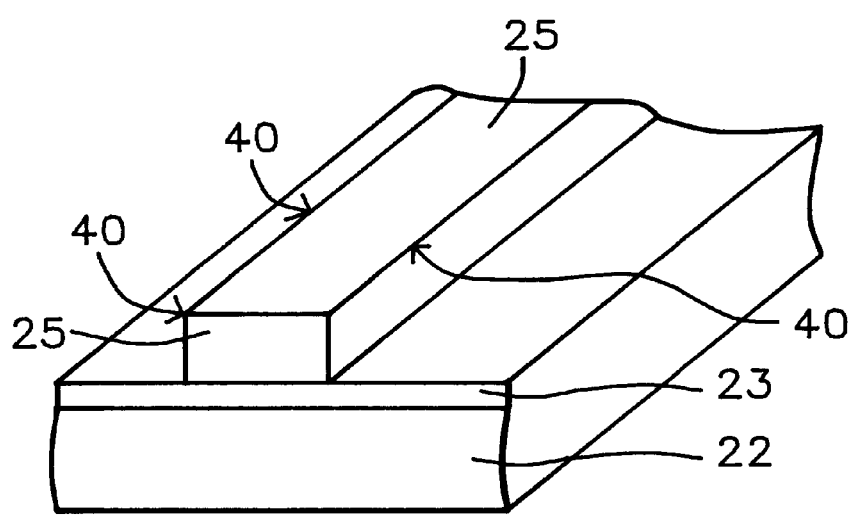
FIG. 3A schematically shows a cross-sectional view of the patterned polysilicon over the insulating substrate before excimer laser recrystallization.
Figure 3B:
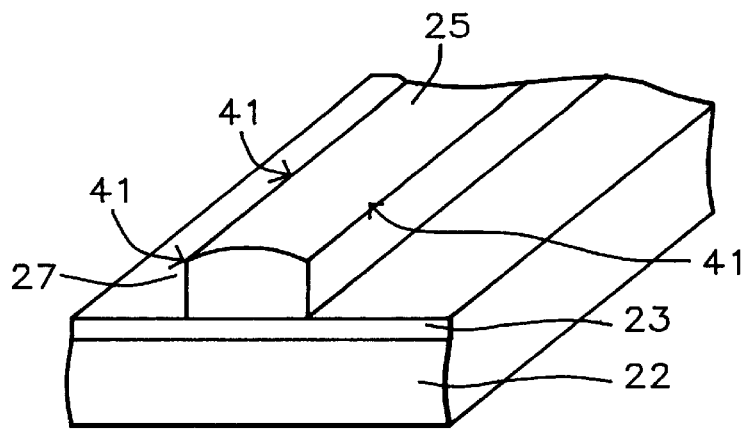
FIG. 3B schematically shows a cross-sectional view of the patterned, recrystallized single crystalline silicon over the insulating substrate after processing by the excimer laser zone-melting and recrystallization from the single crystal seed.

A single crystal silicon seed, 20, cut with the top surface, 21, oriented in the (110) or (100) direction, one of the preferred orientations for single crystal nucleation. This seed is then bonded to the mirror-polished, thermally compatible glass, such as Corning 7059 or 1737 glass, manufactured by Corning Glassworks, Corning, N.Y., having a thickness in the range of 0.5 to 1.8 mm by using an electrostaic bonding method at a temperature between about 200 to 700 deg. C. with a positive bias voltage of about 300 to 2000 volts applied between the seed and the underlying substrate for a duration of about 1 to 10 minutes in a vacuum or clean-room environment. The resulting bonded seed, 20,—substrate, 22, is illustrated in FIG. 1. A layer of silicon oxide, 23, of the thickness in the range of 20 to 1000 nm is then deposited over the glass substrate, 22, and over the sides and top surface of the bonded single crystalline seed by chemical vapor deposition (CVD) or preferably by the plasma enhanced chemical vapor deposition technique (PECVD) at temperature between about 150 to 500 deg. C. by reacting silane with oxygen or nitrous gas. The temperature of this silicon oxide film deposition is low enough not to affect the bonded single crystalline silicon seed or the glass substrate. Conventional photolithography and dry etching, using $CHF_3$ as etchant or wet etching with buffered hydrofluoric acid procedures, are performed to open an aperture, 24, in the oxide over part of the single crystal seed. The native oxide over the surface of the exposed single crystalline seed is stripped in-situ just prior to the deposition of a polysilicon, 25, or amorphous silicon film, 26, to avoid unwanted nucleation from the oxide and promote nucleation from single crystal seed at the interface. The polysilicon or amorphous film is deposited by the CVD or PECVD method to a thickness of 20 to 1000 nm at temperature between about 200 to 600 deg. C. using Silane ($SiH_4$) or silane diluted with inert gas. Afterwards, the polysilicon or amorphous silicon is patterned, 27, by the conventional photolithographic and RIE procedures, an example of this is shown in FIG. 2A. An excimer family of laser, such as XeF, or XeCl, or KrF with a wavelength between 245 and 360 nm having a power intensity of about 0.2 to 0.8 $J/cm^2$ is used to radiate at the polysilicon-single crystal seed jointed area, 28, causing part of the single crystalline seed and the adjacent part of the polysilicon or amorphous silicon to become molten silicon. The excimer laser is then scanning across the newly formed, recrystallized silicon edge toward the next adjacent polysilicon area that is further away from the original single crystal seed. The scanning speed and power intensity of the excimer laser pulse is specified to melt and then cool the silicon to enhance nucleation of the molten silicon, 28, into defect-free single crystalline silicon, 29, from the single crystal seed by this zone-melting technique, as shown in FIG. 2B. As the excimer laser scans along in the direction shown by the arrow in FIG. 2A, to the next adjacent polysilicon segment, the preceeding recrystallized single crystal, 29, will serve as seed for the recrystallization of the subsequent segment of the polysilicon into defect-free single crystal, until the entire patterned polysilicon, 27, is transformed into device grade single crystal, 29. Another advantageous feature of this recrystallized single crystal film is that the sharp corners and edges, 40, of the previous patterned polysilicon layer are now rounded, 41, as shown in FIGS. 3A & 3B, thereby reducing the risk of mechanical stresses which generate from sharpe corners and edges and cause unacceptable level of device leakage currents.

Figure 4:
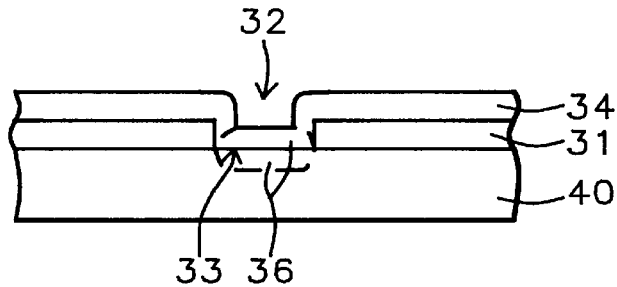
FIG. 4 schematically shows a cross-sectional view of the patterned polysilicon over an insulating film using the underlying single crystalline silicon substrate as a nucleating seed through an aperture in the insulating layer.
Figure 5:
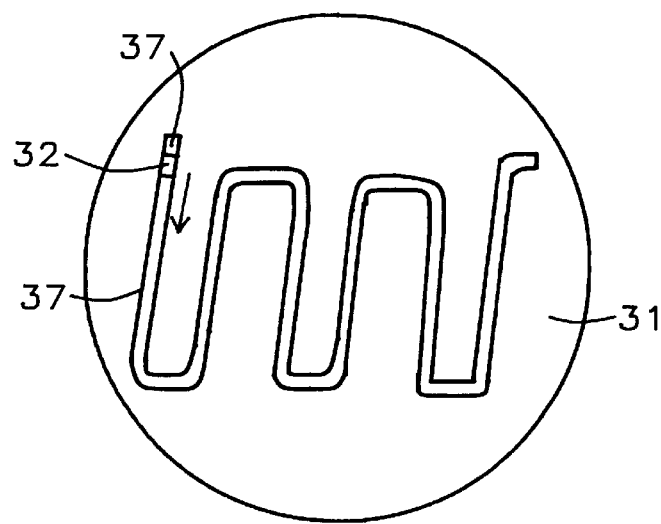
FIG. 5 schematically shows a top view of the patterned polysilicon over an insulating film deposited over a single crystal silicon wafer, with an aperture opening in the insulating layer to allow butting of the polysilicon against the exposed single crystalline silicon substrate through the said aperture.

An alternative method for transforming polysilicon or amorphous silicon into device quality single crystalline silicon using the seeding technique is by using a single crystal substrate, usually in (100) orientation, 30, as shown in FIG. 4. An insulating oxide, 31, of a thickness of about 10 to 1000 nm is either grown by thermal oxidation at temperature between about 800 to 1100 deg. C. or deposited by the low pressure chemical vapor deposition (LPCVD) oxidizing siliane ($SiH_4$) with oxygen or by reacting dichlorosilane (SiCl$_2$H$_2$) with nitrous oxide, or by decomposing tetraethoxysilane (Si[OC$_2$H$_5$]$_4$) to form tetraethylorthosilicate (TEOS) in a LPCVD reactor, at a temperature between about 400 to 900 deg. C. Standard photolithography and dry or wet etching are performed to open an aperture, 32, of approximately 10×10 to 1000×1000 nm$^2$ in size and the underlying single crystalline silicon substrate surface, 33, is exposed at the bottom of this aperture, and the substrate under the bottom of the aperture is now the nucleating seed, 36. The native oxide over this exposed surface of the silicon substrate is removed in-situ just prior to deposition of polysilicon, 34, or amorphous silicon, 35, of approximately 20 to 1000 nm. The polysilicon or amorphous silicon layer is then patterned, 37, by the conventional photolithographic and dry etching processings as shown in FIG. 5 and excimer laser scanning is used to initially melt a portion of the single crystalline silicon substrate, 36, at the bottom of the aperture, 32, and a portion of the polysilicon or amorphous silicon that is butted next to the substrate seed, 36, and then transform and recrystallize the polysilicon or amorphous silicon layer segment by segment from the single crystalline substrate seed into device grade single crystal layer in the direction of the arrow shown in FIG. 5.

Figure 6:
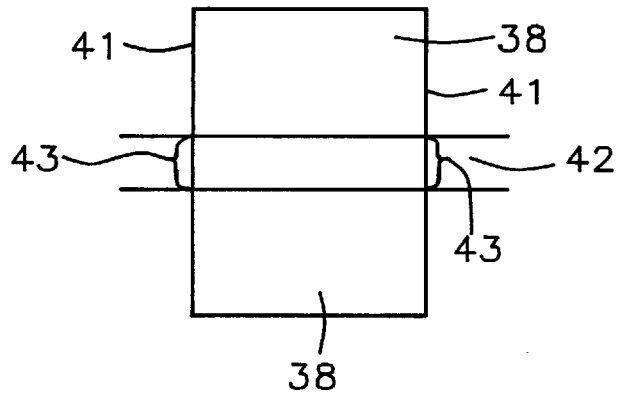
FIG. 6 schematically shows a top view of a section of the patterned recrystallized single crystalline silicon that is processed to form a FET device.

The transformed, recrystallized single crystalline film is then patterned by the standard photolithographic and dry etching processes and doped by ion-implantation with N$^+$ or P$^+$ dopant and then annealed for activation to form source and drain areas for devices such as FET shown in FIG. 6. As the edges of the excimer laser recrsystallized single crystalline film are rounded as shown in FIG. 3B, the risk of having leakage problem between source and drain over the edge of the doped recrystallized single crystal source and drain region, 43, is averted on account of better mechanical strength due to the rounded edges.

Figure 7A:
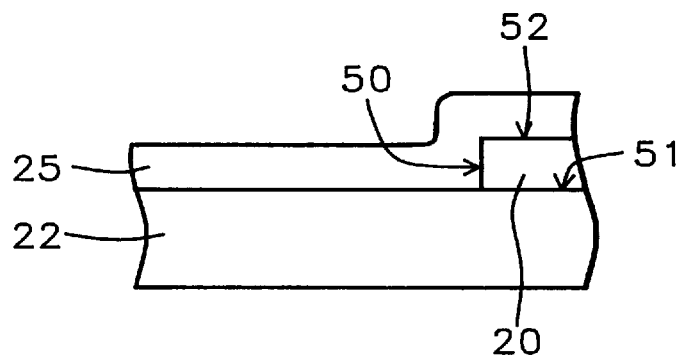
FIG. 7A schematically shows a cross-sectional view of a single crystalline seed that is bonded directly to the glass substrate, and with a polysilicon layer deposited over and the sides and the top surfaces of the single crystalline seed and the remainder surface of the glass substrate.
Figure 7B:
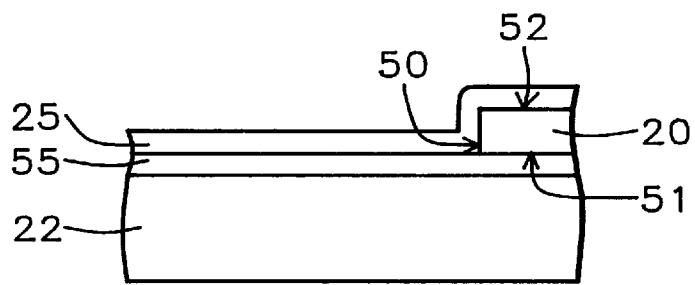
FIG. 7B schematically shows a cross-sectional view of a single crystalline seed that is bonded directly to the insulating layer covering the glass substrate, and with a polysilicon layer deposited over the sides and the top surfaces of the single crystalline seed and the remainder surface of the insulating substrate layer.

Another alternative of the above-noted method of this invention for converting polysilicon and amorphous silicon to single crystalline silicon film on insulator by using the seeding in combination with the the excimer laser irradiation process is processed as follows: A single crystalline silicon seed, 20, with the side surfaces, 50, and the top surface, 52, cut in the (100) orientation. The seed is then bonded to a mirror-polished glass substrate surface as shown in FIG. 7A. The surface of the single crystalline is in-situ cleaned during deposition of a polysilicon layer, 25, or an amorphous silicon layer, 26. Alternatively, the roughness of surface of the substrate may be further minimized by a coating layer of PECVD oxide film, 55, of approximately 200 to 500 nm in thickness at temperature between about 150 to 450 deg.C. prior to bonding of the seed crystal. Then bond the bottom surface, 51, of the single crystalline seed to the insulating oxide film, 55, as shown in FIG. 7B. A polysilicon layer, 25, or amorphous layer, 26, is deposited by the PECVD method described above to a thickness of 20 to 1000 nm. The deposited polysilicon or amorphous silicon is patterned and excimer laser irradiated as described above.

It has been shown above, that the present invention provides a method by which a layer of device quality single crystalline silicon film can be obtained on an oxide insulating layer or on an inexpensive insulator glass or quartz by using the silicon seeding technique in combination with the excimer laser radiation scanning zone-melting processing.

While particular embodiments, operational sequences, etching processing, materials, etc. have been described or illustrated to set forth the principles of the invention, such are not intended to limit the invention to that described or illustrated. Modifications and change will become apparent to those skilled in the art, and it is intended that the scope of the invention be limited only the scope of the appended claims.

What is claimed is:

1. A method for depositing a layer of device quality single crystal silicon on an insulator material by using a single crystalline silicon seed and the radiation of an excimer laser, to provide inexpensive process for manufacturing of displays, sensors, high temperature electronics, high power device, DRAM, radiation hard electrons and optoelectronics, comprising the steps of:

providing a single crystal silicon seed with a top surface of a preferred orientation for single crystal nucleation;

bond the bottom surface of said single crystal seed to a insulator substrate by electrostatic (or anodic) bonding;

depositing a dielectric insulating layer on said single crystal seed and remaining surface of said insulator substrate;

photolithographic processing to open an aperture in the underlying said dielectric insulating layer;

reactive ion etching of said dielectric layer, in said aperture, in said photoresist layer to the top surface of the said single crystalline silicon seed;

in-situ cleaning of the native oxide over the said exposed surface of single crystalline silicon seed in the bottom of said aperture just prior to deposition of an insulating layer;

depositing a polysilicon layer over the said dielectric insulating film and over the exposed single crystal seed in the bottom of said aperture;

photolithographic processing to create pattern in said underlying polysilicon;

reactive-ion -etching of said polysilicon layer;

irradiate the single crystalline silicon seed/polysilicon junction area by an excimer laser having an energy intensity in the range of 0.2 to 0.8 J/cm$^2$ to melt the seed/polysilicon junction into a molten mass;

scan the excimer laser away from the molten region toward the neighboring polysilicon section at a scanning speed that will create the temperature gradient profile to allow recrystallization of the molten silicon mass from the seed into defect-free, device quality single crystalline film; and continuous scanning the polysilicon from the molten zone segment by segment until the polysilicon is completely transformed into single crystalline silicon from preceding recrsytallized single crystalline seed.

2. The method of claim 1, wherein the top surface of said single crystalline silicon seed is of (100).

3. The method of claim 1, wherein the substrate bonded to the bottom surface of the single crystalline silicon seed is mirror-polished glass.

4. The method of claim 1, wherein the bonding of the seed to the substrate is by heating at a temperature between about 200 to 700 deg. C. with a positive voltage bias of 300 to 2000 Volts applied between the seed and the substrate.

5. The method of claim 1, wherein the dielectric insulating layer deposited over the single crystalline seed and the remainder of said substrate, the portion that is not covered by the seed, is oxide formed by the plasma enchanced chemical vapor deposition or by chemical vapor deposition.

6. The method of claim 1, wherein the polysilicon deposited over the said dielectric insulating oxide layer is intrinsic.

7. The method of claim 1, wherein the patterned recrystallized single crystalline silicon film is doped by ion-implantation or by in-situ doping with P- or N-type dopant.

8. A method for depositing a layer of device quality single crystal silicon on an insulator material by using a single crystalline silicon seed and the radiation of an excimer laser, comprising the steps of:

provided a single crystal silicon seed with prepared side surfaces and the top surface having an orientation of (100) direction, the preferred orientation for single crystalline nucleation;

bonding the seed to a mirror-polished glass;

depositing an intrinsic polysilicon layer having a thickness in the range of 20 to 1000 nm by the LPCVD processing at temperature between about 500 to 800 deg. C. over the seed and the glass substrate;

irradiating and melting the butted junction areas between the single crystalline seed and the polysilicon by an excimer laser; and scanning said excimer laser from the molten single crystalline silicon seed/polysilicon junction region toward adjacent polysilicon section until all the polysilicon has been recrystallized into single crystal film.

9. The method of claim 8, additionally comprising the removal of the native oxide over the sides and the top surfaces of the single crystal seed by in-situ cleaning just prior to said polysilicon deposition.

10. The method of claim 8, wherein the substrate consists of depositing an insulating oxide layer of approximately 20 to 1000 nm over the mirror-polish glass substrate by the PECVD technique at a temperature between about 150 to 500 deg.C.

11. The method of claim 8, wherein said preferred orientation for the single crystal silicon seed is of (110) orientation.

12. The method of claim 8, wherein said preferred orientation for the single crystal silicon seed is of (111) orientation.

* * * * *